(12) United States Patent
Forbes et al.

(10) Patent No.: US 6,337,805 B1
(45) Date of Patent: *Jan. 8, 2002

(54) DISCRETE DEVICES INCLUDING EAPROM TRANSISTOR AND NVRAM MEMORY CELL WITH EDGE DEFINED FERROELECTRIC CAPACITANCE, METHODS FOR OPERATING SAME, AND APPARATUSES INCLUDING SAME

(75) Inventors: Leonard Forbes, Corvallis, OR (US); Wendell P. Noble, Milton, VT (US); Kie Y. Ahn, Chappaqua, NY (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/461,009

(22) Filed: Dec. 15, 1999

Related U.S. Application Data

(63) Continuation-in-part of application No. 09/385,380, filed on Aug. 30, 1999, now Pat. No. 6,141,238.

(51) Int. Cl.[7] .............................................. G11C 11/22
(52) U.S. Cl. ...................................... 365/145; 365/149
(58) Field of Search .................................. 365/145, 149

(56) References Cited

U.S. PATENT DOCUMENTS

| 5,345,415 A | * | 9/1994 | Nakao et al. | 365/145 |
| 5,515,311 A | * | 5/1996 | Mihara | 365/145 |
| 5,592,409 A | * | 1/1997 | Nishimura et al. | 365/145 |
| 5,640,030 A | * | 6/1997 | Kenney | 365/145 |
| 5,689,456 A | * | 11/1997 | Kobayashi | 365/145 |
| 5,721,700 A | * | 2/1998 | Katoh | 365/145 |
| 5,768,185 A | * | 6/1998 | Nakamura et al. | 365/145 |
| 5,903,492 A | * | 5/1999 | Takashima | 365/145 |

* cited by examiner

Primary Examiner—Trong Phan
(74) Attorney, Agent, or Firm—Dickstein Shapiro Morin & Oshinsky LLP

(57) ABSTRACT

A memory cell includes a charge amplifier having a gate adjacent to a channel region coupling source and drain regions, a digitline coupled to one of the source and drain regions, a ground lead coupled to the other of the source and drain regions, a ferroelectric capacitor coupled to the gate, and a wordline coupled to the ferroelectric capacitor. Advantageously, the charge amplifier can be a CMOS transistor. Preferably, the gate is coupled to the ferroelectric capacitor by polysilicon, the junction formed at the gate has an intrinsic capacitance, and the capacitance of the ferroelectric capacitor is based on the magnitude of the intrinsic capacitance. Alternatively, the gate is coupled to the ferroelectric capacitor by polysilicon, the junction formed at the gate has an intrinsic capacitance, and the physical size of the ferroelectric capacitor is based on the magnitude of the intrinsic capacitance. In this case, the thickness of a ferroelectric material layer in the ferroelectric capacitor can be based on the magnitude of the intrinsic capacitance. A memory cell array, a memory module, and a processor based system can all be fabricated from this memory cell. Methods for reading data out of and writing data into the memory cell are also described.

55 Claims, 13 Drawing Sheets

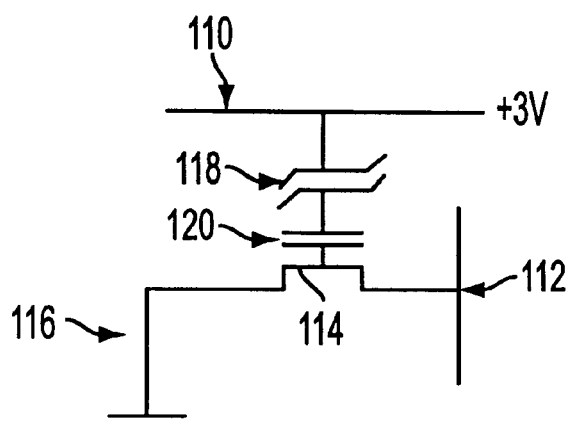 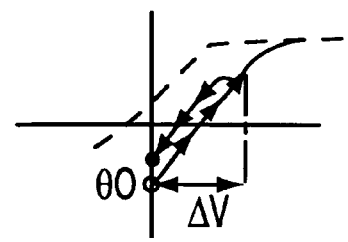
FIG. 6(a)  FIG. 6(b)
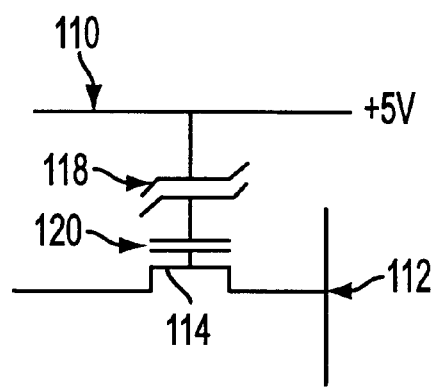 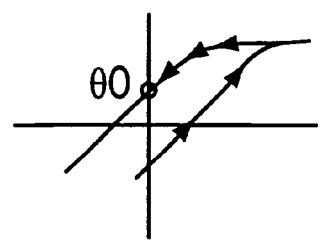
FIG. 6(c)  FIG. 6(d)
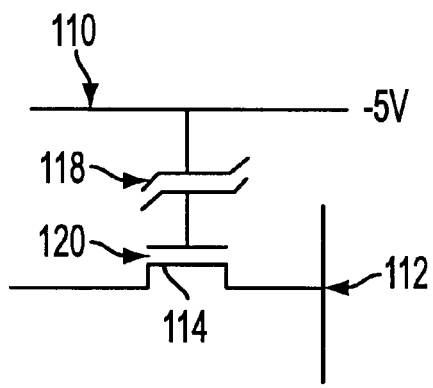 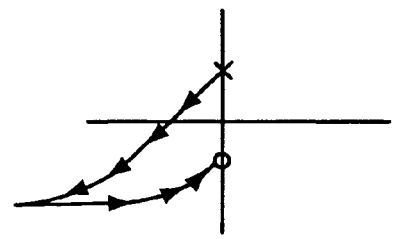
FIG. 6(e)  FIG. 6(f)

DISCRETE DEVICES INCLUDING EAPROM TRANSISTOR AND NVRAM MEMORY CELL WITH EDGE DEFINED FERROELECTRIC CAPACITANCE, METHODS FOR OPERATING SAME, AND APPARATUSES INCLUDING SAME

This is a Continuation-in-Part of U.S. application Ser. No. (09/385,380), which is entitled "DYNAMIC RANDOM ACCESS MEMORY (DRAM) CELLS WITH REPRESSED FERROELECTRIC MEMORY, METHODS OF READING SAME, AND APPARATUS INCLUDING SAME", and which was filed on Aug. 30, 1999, now U.S. Pat. No. 6,141,238.

BACKGROUND OF THE INVENTION

1. Field of the Invention

The present invention relates to discrete elements such as electrically alterable programmable read-only memory (EAPROM) and nonvolatile random access memory (NVRAM) devices. More specifically, the present invention relates to EAPROM and NVRAM cells where data is stored using a ferroelectric capacitor incorporated in the cells. Methods for operating, writing to and reading from, such DRAM, logic devices, memory arrays, and systems containing these cells are also disclosed.

2. Description of Related Art

Dynamic random access memories (DRAMs) are the most cost-effective, high-speed memory used with present day computers. DRAMS last nearly indefinitely. Moreover, DRAMs are available in very high density configurations, e.g., 64 megabytes (MB). However, DRAMS can only store information for a limited time without constant refreshing and lose all knowledge of their state once power is removed.

Ferroelectric capacitors are currently being used as nonvolatile memory devices, as disclosed in U.S. Pat. No. 4,888,733, which is entitled "Nonvolatile Memory Cell and Sensing Method" and discloses a two transistor, one capacitor (2T/1C) memory cell. In addition, ferroelectric capacitors are often employed in nonvolatile random access memories (NVRAMs). Memory cells having structures approximating that of DRAMs, i.e., arranged in the conventional one transistor, one capacitor (1T/1C) memory cell pattern, are disclosed in U.S. Pat. Nos. 5,600,587 (Ferroelectric Random Access Memory), 5,572,459 (Voltage Reference for a Ferroelectric 1T/1C Based Memory), 5,550,770 (Semiconductor Memory Device Having FE Capacitor Memory Cells with Reading, Writing, and Forced Refreshing Functions and a Method of Operating the Same), 5,530,668 (Ferroelectric Memory Sensing Scheme Using Bit Lines Precharged to a Logic One Voltage), and 5,541,872 (Folded Bit Line Ferroelectric Memory Device). It should be mentioned that all of the patents cited above are incorporated by reference herein for all purposes.

In the above-mentioned patents, the capacitor in a 1T/1C DRAM structure is replaced by a ferroelectric capacitor, as illustrated in FIG. 1(a). The memory cell 1 of FIG. 1(a) includes a wordline 10, a digitline 12, a transistor 14 and a ferroelectric capacitor 16. In operation, the remnant charges are detected on a bit line in a manner similar to the operation of a conventional DRAM. However, these structures are not without attendant problems.

There is an extensive body of literature on both the electrical characteristics of ferroelectric capacitors and applications in cells similar to conventional DRAMs, except that these cells are classified as nonvolatile RAMs (NVRAMs) instead of DRAMs. One recent publication by K. Asaril et al., entitled "Multi-Level Technologies for FRAM Embedded Reconfigurable Hardware" (IEEE Int. Solid-State Circuits Conf., San Francisco 1999, pp. 108–109), describes the use of a ferroelectric capacitor in a ferroelectric RAM (FRAM)which is employed with low voltage to store and access RAM data superimposed on less-frequently accessed read-only memory (ROM) data in the same cell. See U.S. Pat. No. 5,539,279, entitled "Ferroelectric Memory." The RAM data is volatile and needs to be refreshed on a regular basis, or this aspect of the cell acts like a DRAM. The electrically alterable read-only memory (EAROM), e.g., an electrically erasable programmable ROM (EEPROM) data is nonvolatile. In other words, the FRAM acts like a DRAM with a "repressed" nonvolatile read only "memory," or "repressed memory."

Other applications use the ferroelectric capacitors as part of a stacked gate structure similar not to DRAMs but rather to EEPROM or flash memory devices. See, for example, U.S. Pat. Nos. 5,541,871 ("Nonvolatile Ferroelectric Semiconductor Memory") and 5,856,688("Integrated Circuit Memory Devices Having Nonvolatile Single Transistor Unit Cells Therein"), which patents are also incorporated herein by reference for all purposes. It will be appreciated that in these devices, however, the remnant charge or polarization charge of the ferroelectric element is used to store information rather than electrons injected onto or removed from a floating gate by hot electron effects and/or tunneling. Instead, the charge differences are not differences in the number of electrons trapped on the gate but rather the polarization charge of the upper ferroelectric capacitor.

It should also be mentioned that the prior art referenced in U.S. Pat. No. 5,541,871describes a basic structure consisting of a ferroelectric capacitor in series with a gate capacitance, which are both planar structures. As shown in FIG. 1(b), a memory cell 1' includes a wordline 10, a digitline 12, a transistor 14, and a ferroelectric capacitor 20, one plate of the ferroelectric capacitor forming the gate of the transistor 14.

FIG. 1(c) illustrates a memory cell 1", which includes the wordline 10, digitline 12, transistor 14, a high dielectric capacitor 30 and a ferroelectric capacitor 32. It will be noted that the lower plate of capacitor 30 forms the control gate of the transistor 14.

The problem with this disclosed structure is that the ferroelectric elements have very high electric permittivities as, for instance, 80 and 150 k. It will be appreciated that these permittivity values are 20 to 40 times higher than that of silicon dioxide. It will also be appreciated that, if comparable thicknesses of materials as are used in constructing the ferroelectric and conventional capacitors, only a small fraction, e.g., 2% to 5%, of the voltage applied across the series capacitors will appear across the ferroelectric capacitor. Thus, if the ferroelectric capacitor has a coercive voltage, Vc, i.e., the voltage required for programming, of 1 V or 3 V, then the total word line voltage required for programming the memory cell will be on the order 20 V to 150 V. It will be noted that these are far in excess of voltages used on current CMOS-integrated circuits.

U.S. Pat. No. 5,856,688 seeks to solve this problem by using a "C" shaped floating gate and two control gates. One control gate is a plate of the ferroelectric capacitor and the other control gate is a plate of another capacitor fabricated using a high dielectric constant material. The two capacitors in series, one with a high dielectric constant ferroelectric and the other with a high dielectric constant insulator, are used to program the ferroelectric capacitor at lower voltages. Since the capacitances are more or less comparable, the programming voltage will divide more equally, resulting in a significant fraction across the ferroelectric capacitor.

It should be mentioned that other repressed memory devices have been proposed. For example, a repressed memory where the NVRAM function is provided by a flash memory type structure for the gate of the transfer device is described in the commonly assigned, copending application entitled "DRAM AND SRAM MEMORY CELLS WITH REPRESSED MEMORY" (Ser. No. (09/362,909, filed Jul. 29, 1999), which application is incorporated herein by reference for all purposes. It will be appreciated that these memories do not function like the shadow RAM disclosed in U.S. Pat. 5,399,516 ("Method of Making a Shadow Ram Cell Having a Shallow Trench EEPROM"), storing the same information on both memory planes.

In contrast, U.S. application Ser. No.09/385,380, describes a memory cell 1''' having first and second operating modes. The memory cell 1''' includes a charge transfer transistor 14 having a gate adjacent to a channel region coupling source and drain regions, a digitline 12 coupled to one of the source and drain regions, a storage capacitor 16 coupled to the other of the source and drain regions, a ferroelectric capacitor 32, and a wordline 10 coupled to the gate by the ferroelectric capacitor 32. The polysilicon vertical interconnect connecting the ferroelectric capacitor 32 with oxide layer covering the gate of the transistor 14 forms an intrinsic capacitor 30. See FIG. 1(d). Data is written to and read out of the storage capacitor during the first operating mode, i.e., a normal DRAM access speeds, and written to and read out of the ferroelectric capacitor during the second mode of operation, i.e., at speeds several times slower than normal DRAM access speeds.

It would be very desirable if a memory cell or device could be developed with all of the positive features of DRAMS, i.e., cost, size, speed, availability, etc., which also is nonvolatile, i.e., maintains its memory state with power removed. It would be highly desirable to have a memory element and corresponding system that functions at speeds comparable to that of today's DRAMs. It would also be desirable if at least one logic device could be implement using a modified form of the memory cell.

SUMMARY OF THE INVENTION

Based on the above and foregoing, it can be appreciated that there presently exists a need in the pertinent art which mitigates the above-described deficiencies.

In one aspect, the present invention provides a one transistor/one capacitor (1T/1C) memory cell including a ferroelectric capacitor operatively coupled to the gate electrode of a charge amplifier. Preferably, the ferroelectric capacitor has a small surface area relative to the surface area of the gate electrode and, most preferably, the ferroelectric capacitor is an edge defined ferroelectric capacitor. In an exemplary embodiment, the charge amplifier is a transistor.

In another aspect, the present invention provides a memory cell including a charge amplifier having a gate adjacent to a channel region coupling source and drain regions, a digitline coupled to one of the source and drain regions, a ground lead coupled to the other of the source and drain regions, a ferroelectric capacitor coupled to the gate, and a wordline coupled to the ferroelectric capacitor. Advantageously, the charge amplifier can be a transistor. Preferably, the gate is coupled to the ferroelectric capacitor by polysilicon, the junction formed at the gate has an intrinsic capacitance, and the capacitance of the ferroelectric capacitor is based on the magnitude of the intrinsic capacitance. Alternatively, the gate is coupled to the ferroelectric capacitor by polysilicon, the junction formed at the gate has an intrinsic capacitance, and the physical size of the ferroelectric capacitor is based on the magnitude of the intrinsic capacitance. In this case, the thickness of a ferroelectric material layer in the ferroelectric capacitor can be based on the magnitude of the intrinsic capacitance.

In yet another aspect, the present invention provides a one transistor/one capacitor (1T/1C) memory cell array, wherein each of the 1T/1C memory cells is a ferroelectric capacitor operatively coupled to the gate electrode of a charge amplifier. Preferably, the charge amplifier is a transistor and, most preferably, the charge amplifier is a CMOS transistor. In an exemplary embodiment, the memory cell array is N rows by M columns of memory cells, and wherein the each of the M columns is defined by an associated digitline and an associated source line.

In still another aspect, the present invention provides a memory cell array, including a plurality of memory cells organized as an array of rows and columns, at least one of the memory cells being a non-volatile memory cell including a charge transistor having a gate opposing a channel region coupling source and drain regions, a digitline coupled to the drain region, a source line coupled to the source region, a ferroelectric capacitor which stores data coupled to the gate, a wordline coupled to the ferroelectric capacitor, and a sense amplifier coupled to the digitline of the at least one memory cell.

In another aspect, the present invention provides a processor based system, including a processor, and a memory cell array coupled to the processor, the memory cell array including a plurality of memory cells organized as an array of rows and columns, at least one of the memory cells being a non-volatile memory cell including a charge amplifier including a gate opposing a channel region coupling source and drain regions, a digitline coupled to the drain region, a source line coupled to the source region, a ferroelectric capacitor coupled to the gate, a wordline coupled to the ferroelectric capacitor, and a sense amplifier coupled to the digitline of the at least one memory cell.

In a still further aspect, the present invention provides a memory module, including a substrate including a circuit board, a plurality of memory chips mounted on the die substrate, wherein one or more of the memory chips comprise a memory cell array fabricated on the semiconductor chip communicating with a processor, the memory cell array including at least one non-volatile memory cell including a ferroelectric capacitor operatively coupled to the gate of a charge amplifier.

In still another aspect, the present invention provides a method for reading information from a one transistor/one capacitor (1T/1C) memory cell having a charge amplifier including a gate disposed adjacent to a channel region coupling source and drain regions, a digitline coupled to drain region, a source line coupled to the source region, a ferroelectric capacitor coupled to the gate, and a wordline coupled to the ferroelectric capacitor, the method including grounding the source line, asserting the wordline and digitline, amplifying the charge on the ferroelectric capacitor, and determining the resultant charge on the digitline.

In yet another aspect, the present invention provides a method for writing information to a one transistor/one capacitor (1T/1C) memory cell having a charge amplifier including a gate disposed adjacent to a channel region coupling source and drain regions, a digitline coupled to drain region, a source line coupled to the source region, a ferroelectric capacitor coupled to the gate, and a wordline coupled to the ferroelectric capacitor, the method including asserting the source line, asserting the wordline to thereby apply a potential greater than the coercive voltage of the ferroelectric capacitor across the ferroelectric capacitor and the charge amplifier.

In another aspect, the present invention provides a logic element, including N+1 source/drain regions, N channels, each channel coupling adjacent ones of the N+1 source/drain regions, N gates disposed adjacent to the N channels, N ferroelectric capacitors, each of the N ferroelectric capacitors coupled to a respective one of the N gates, N wordlines, each of the N wordlines coupled to a respective one of the N ferroelectric capacitors, a digitline couple to an end one of the N+1 source/drain regions, and a source line coupled to the other end one of the N+1 source/drain regions. Preferably, the logic element is operated by assertion of all of the N wordlines. Advantageously, the ferroelectric capacitors are edge defined ferroelectric capacitors.

BRIEF DESCRIPTION OF THE DRAWINGS

These and various other features and aspects of the present invention will be readily understood with reference to the following detailed description taken in conjunction with the accompanying drawings, in which:

FIG. 1 (c) illustrates a third use of a ferroelectric capacitor in a conventional memory cell;

FIGS. 6(a), 6(c) 6(e) illustrate the application of various voltages to selected portions of the circuitry illustrated in FIG. 2(a);

FIGS. 6(b), 6(d) 6(f) are hysteresis diagrams illustrating the effects on the ferroelectric capacitor of the voltages specified in FIGS. 6(a), 6(c) 6(e), respectively;

DETAILED DESCRIPTION OF THE PREFERRED EMBODIMENTS

Illustrative embodiments and exemplary applications will now be described with reference to the accompanying drawings which disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments and equivalent substitutions within the scope of the invention and additional fields in which the present invention would be of significant utility.

Figure 1A:
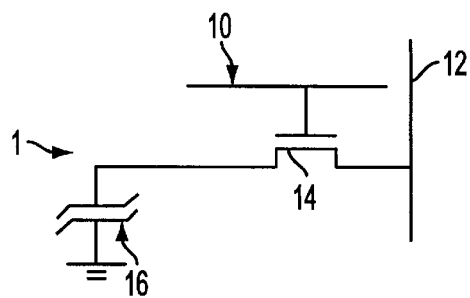
FIG. 1 (a) illustrates a first use of a ferroelectric capacitor in a conventional memory cell.
FIG. 1(b) illustrates a second use of a ferroelectric capacitor in a conventional memory cell.
FIG. 1(d) illustrates a fourth use of a ferroelectric capacitor in a memory cell.
Figure 1B:
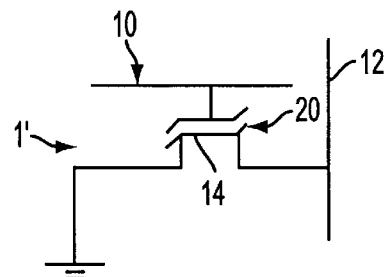
Figure 1C:
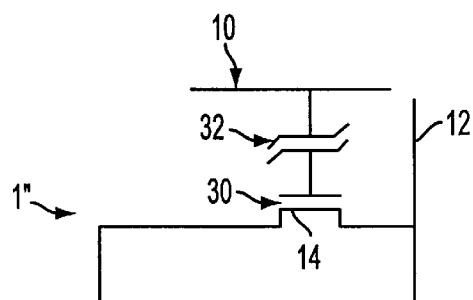
Figure 1D:
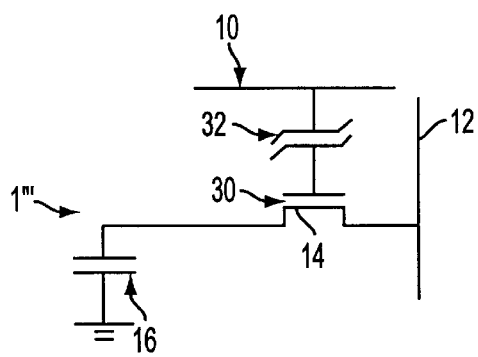
Figure 2A:
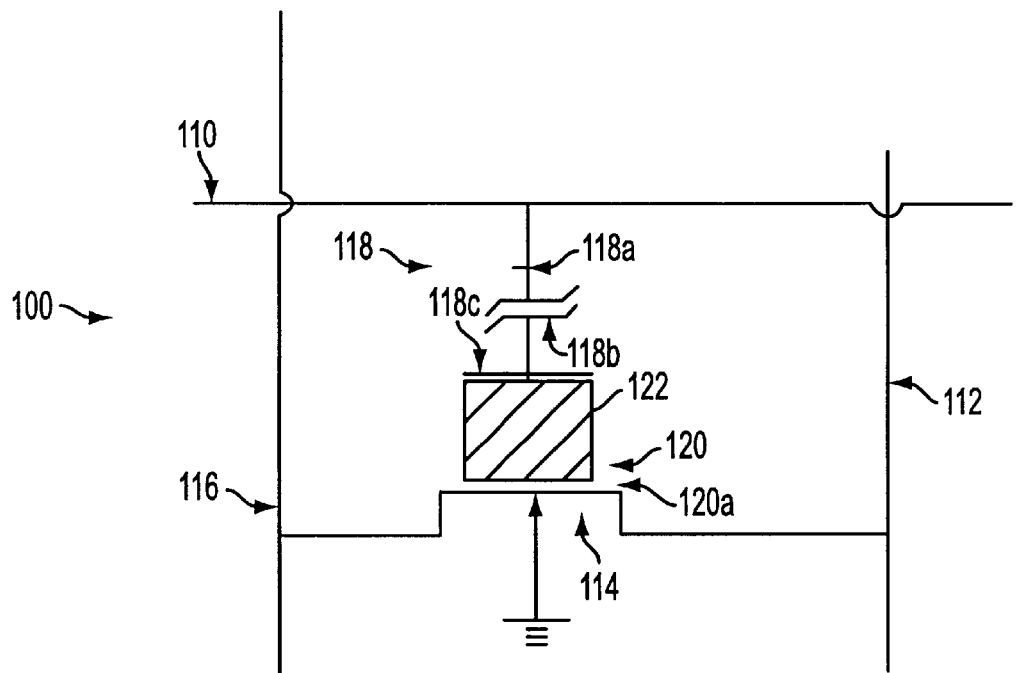
FIG. 2(a) illustrates a NVRAM memory cell employing a ferroelectric capacitor according to the present invention.

FIG. 2(a) illustrates the basic transistor and memory cell 100 electrical configuration according to the present invention, which preferably includes a transistor 114 connected between a source line 116 and a digitline 112. In addition, a stacked capacitor gate structure is provided, which includes a polysilicon gate capacitance 120 and a small area ferroelectric capacitor 118. More specifically, the memory cell 100 according to the present invention includes a wordline 110, a digitline 112, a transfer device, e.g., a transistor, 114, a source line 116 and a ferroelectric capacitor 118. It will be appreciated that the transition between the active region of the transfer device 114 and the polysilicon interconnect 122 to the wordline 110 is an oxide layer 120a, which forms a gate capacitor 120. The basic memory cell 100 advantageously can be employed in the memory cell array 142 illustrated in FIG. 2(b), which is discussed in greater detail below.

Figure 3A:
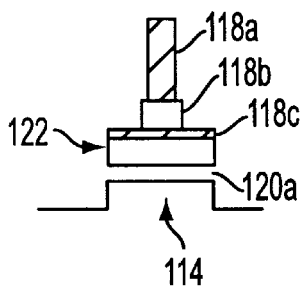
FIG. 3(a) illustrates selected portions of the components used in the memory cell depicted in FIGS. 2(a) and 2(b)

A more detailed illustration of the transfer device 114, intrinsic gate capacitor 120, polysilicon interconnect 122 and ferroelectric capacitor 118 is provided in FIG. 3(a). It should be mentioned that the ferroelectric capacitor 118 preferably includes Platinum (Pt) electrodes 118a, 118c sandwiching a ferroelectric layer 118b, which will be described in greater detail below. The characteristics of the ferroelectric layer 118b and the gate oxide layer 120a are listed in the table below.

Figure 3B:
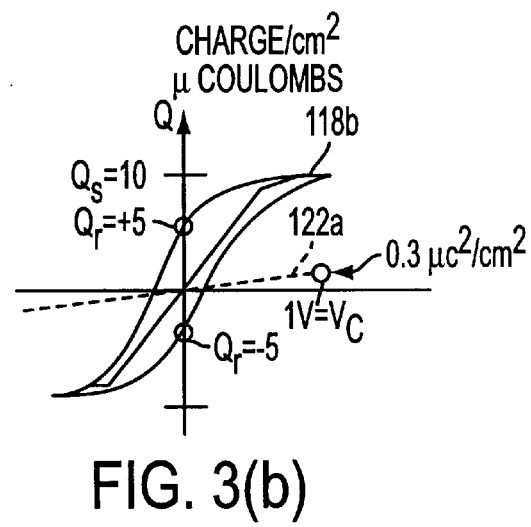
FIG. 3(b) illustrates the hysteresis characteristic of the ferroelectric capacitor employed in the memory cell illustrated in FIGS. 2(a) and 2(b)

FIG. 3(b) illustrates a hysteresis loop characteristic of ferroelectric material 118b in comparison to the linear response of an oxide material 120a. In FIG. 3(b), $V_c$ indicates coercive voltage, $Q_r$ is remnant charge, $Q_s$ is saturation charge; the Y axis represents charge/centimeter squared in micro-coulombs. It will be appreciated that as long as the applied voltage is less than $V_c$, the charge will follow the linear profiles indicated for layers 118b and 120a. Once $V_c$ has been exceeded, which corresponds to an applied voltage of approximately 1 V, the layer 118b follows the hysteresis profile. Thus, by applying a relatively large voltage, e.g.,±5.0 V, the layer 118b will exhibit a remnant charge $Q_r$, which advantageously can be positive or negative. Since $Q_r$ will effect the threshold voltage $V_{th}$ of transistor 114, the polarity of $Q_r$ can be determined by ascertaining the effect on $V_{th}$, as discussed in greater detail below.

TABLE I

| Layer | Ferroelectric Layer 118b | Gate Oxide Layer 120a |
|---|---|---|
| Thickness | 800 Å | 100 Å |
| Relative Permittivity $\epsilon_r$ | 80 | 4 |
| Area | 0.2 $\mu m^2$ | 1.0 $\mu m^2$ |
| Capacitance Per Unit Area | 8.85 fF/$\mu m^2$ | 3.54 fF/$\mu m^2$ |
| Capacitance of Device | 1.77 fF | 3.54 fF |

It should also be mentioned that the ferroelectric characteristics depicted in FIG. 3(b) and Table I are that of a common ferroelectric, e.g., SrBiTaO, although other ferroelectric materials advantageously can be used, as discussed in greater detail below.

It will be appreciated that since the effective dielectric constant of the ferroelectric material is so large, only a small area is required for the ferroelectric capacitor 118. In contrast, the capacitor 120 has the normal gate capacitance of a minimum-sized transistor 114 in CMOS technology. For purposes of illustration, the values presented in Table 1 are characteristic of 1 micron CMOS technology employing 5 V power supplies. It will be appreciated that these values advantageously can be scaled, as appropriate, to smaller CMOS technologies with critical dimensions smaller than 1 micron. As mentioned above, the gate capacitance, i.e., the intrinsic capacitance of capacitor 120, of a transistor 114 in this technology with a gate oxide thickness of approximately 100 Å is about 3.3 fF.

As mentioned above, the charge storage element of a ferroelectric memory cell consists of a ferroelectric film sandwiched between two electrodes. Lead zirconate titanates, $PbZr_xTi_{1-x}O_3$ (PZT) with x=0.4–0.53 are most studied materials for the ferroelectric film. It will be appreciated that this is because PZT films with thickness from 500 to 4000 Å can fill the ferroelectric material requirements to a substantial degree. Furthermore, it has been shown that PZT film processing can be done in combination with standard integrated circuit processing, as discussed in the article by R. Cuppens, et al., entitled "Ferroelectrics for Non-volatile Memories" (Microelectronic Engineering, 19 (1992), pp. 245–252, 1992). Other thin-film materials potentially usable for nonvolatile memory devices include $BaMgF_4$ and $Bi_4Ti_3O_{12}$ for application with the ferroelectric material gate insulator in a field effect transistor (FET). Moreover, $BaTiO_3$, $SrTiO_3$ and $(Sr,Ba)TiO_3$ advantageously can be employed for application as dielectrics in DRAMs.

Another important class of ferroelectric materials is the bismuth (Bi)-layer oxides. Bi-layer ferroelectric oxides have large polarization along the a or b axis, but no or little polarization along the c axis. $Bi_4Ti_3O_{12}$ is a typical bi-layer ferroelectric material. However, the obtained remnant polarization is very small, i.e., less than 10 $\mu C/cm^2$ and fatigue endurance is less than optimal. Recently, other types of bi-layer oxides, such as $SrBi_2Ta_2O_9$ or $SrBi_2Nb_2O_9$ hve demonstrated acceptable endurance. Amanuma, et al., recently reported a simple solution deposition process of $SrBi_2Ta_2O_9$ (SBT) thin films in the article entitled "Preparation and Ferroelectric Properties of $SrBi_2Ta_2O_9$ Thin Films" (Appl. Phys. Lett., 66 (2), pp. 221–223, 1995).

Referring back to FIG. 3(a), the ferroelectric capacitor 118 is illustrated as a capacitor on top of the gate of the transistor 114, which is connected to the gate of transistor 114 by polysilicon interconnect 122, which is, in an exemplary case, approximately 2000 Å thick. Preferably, the ferroelectric capacitor 118 is fabricated by depositing a ferroelectric material between two Pt plates or electrodes, one of the electrodes, e.g., electrode 118a, being a vertical Pt wordline. The ferroelectric capacitor 118 advantageously has an effective plate area of only about one-fifth that of the gate oxide capacitor 120. Moreover, the ferroelectric dielectric 118b will typically be thicker, approximately 800 Å, than the gate oxide 120a, approximately 100 Å. It will be appreciated that by properly sizing the ferroelectric capacitor 118 and the intrinsic gate capacitor 120, the gate oxide capacitance and the ferroelectric capacitances can be made comparable. Thus, when the coercive or programming voltage $V_c$ of the ferroelectric capacitor 118 is on the order of 1 V, then the memory cell 100 can be programmed with a voltage as low as ±5 V. It will be appreciated that both of these values are consistent with and, in fact, less than used in 1 micron flash memory CMOS technology.

Thus, one preferred embodiment of the present invention is a one transistor/one capacitor (1T/1C) memory cell including a ferroelectric capacitor operatively coupled to the gate electrode of a charge amplifier. Preferably, the ferroelectric capacitor has a small surface area relative to the surface area of the gate electrode and, most preferably, the ferroelectric capacitor is an edge defined ferroelectric capacitor, i.e., a capacitor formed by running the ferroelectric film over a step in the workpiece and then anisotropically etching the film in the vertical direction. In an exemplary embodiment, the charge amplifier is a transistor.

An exemplary embodiment according to the present invention provides a memory cell including a charge amplifier having a gate adjacent to a channel region coupling source and drain regions, a digitline coupled to one of the source and drain regions, a ground lead coupled to the other of the source and drain regions, a ferroelectric capacitor coupled to the gate, and a wordline coupled to the ferroelectric capacitor. Advantageously, the charge amplifier can be a transistor. Preferably, the gate is coupled to the ferroelectric capacitor by polysilicon, the junction formed at the gate has an intrinsic capacitance, and the capacitance of the ferroelectric capacitor is based on the magnitude of the intrinsic capacitance. Alternatively, the gate is coupled to the ferroelectric capacitor by polysilicon, the junction formed at the gate has an intrinsic capacitance, and the physical size of the ferroelectric capacitor is based on the magnitude of the intrinsic capacitance. In this case, the thickness of a ferroelectric material layer in the ferroelectric capacitor can be based on the magnitude of the intrinsic capacitance. In an exemplary case, the ferroelectric capacitor is a dielectric layer of lead zirconate titanate (PZT). Most preferably, the PZT forming the ferroelectric capacitor is of the form $PbZr_xTi_{1-x}O_3$ with x ranging between 0.4 and 0.53

Figure 2B:
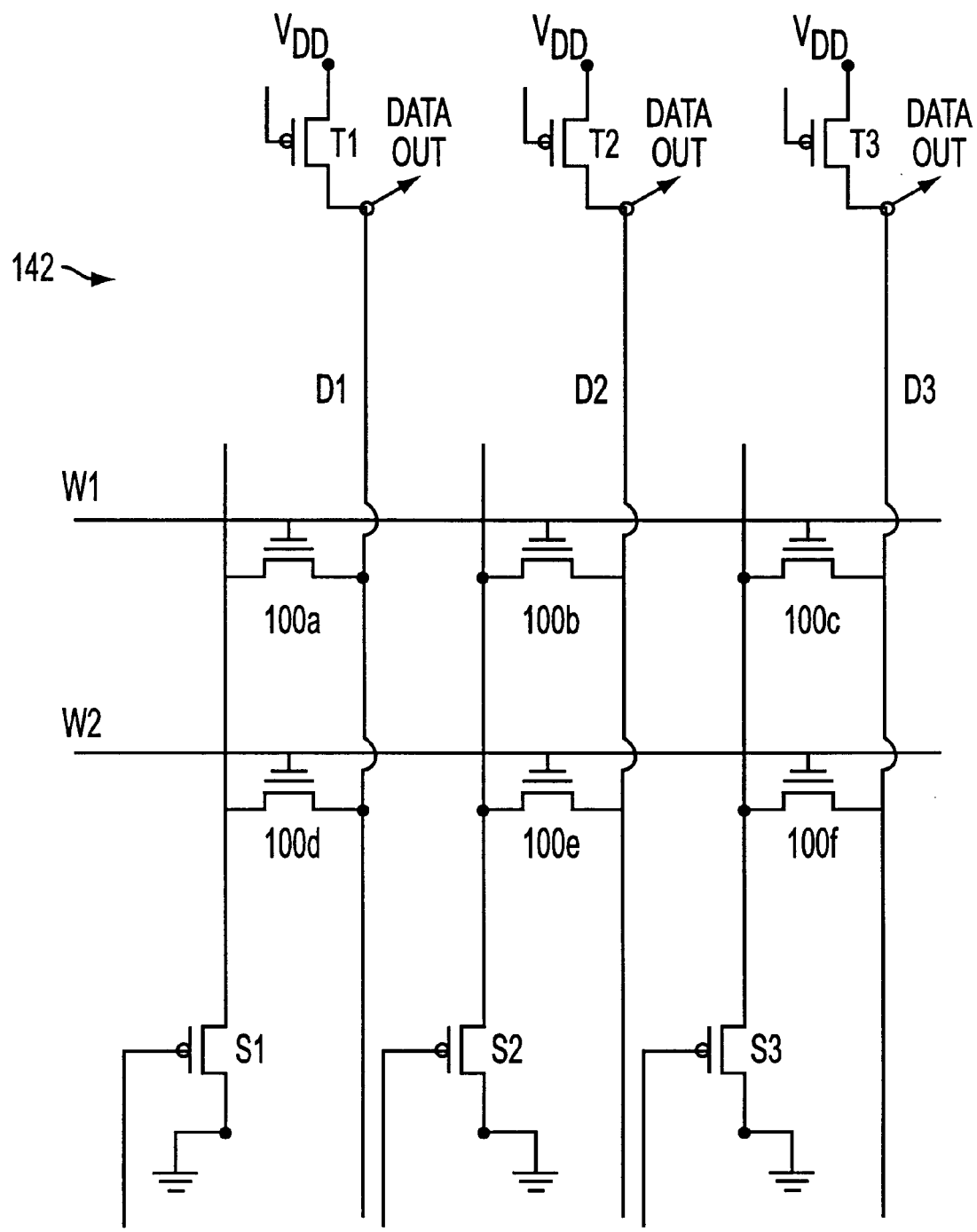
FIG. 2(b) illustrates a NVRAM memory cell array employing a ferroelectric capacitor according to the present invention.

Referring now to FIG. 2(b), the memory array 142 advantageously can be formed from the NVRAM memory cell illustrated in FIG. 2(a). Preferably, the memory cell array 142 includes a plurality of NVRAM memory cells, e.g., cells 100a, 100b, 100c, connected to one another by a common word line W1. Each of the NVRAM memory cells, e.g., NVRAM memory cell 100a, advantageously can be addressed by a corresponding digit line, e.g., digit line D1, which preferably addresses other VRAM memory cells, e.g., cell 100d, and which can be recharged for read out via a pullup transistor, e.g., transistor T1. It will be appreciated that transistor T1 is switched for readout in the normal manner. In addition, the source terminals for a column of memory cells 100 are connected to a ground via a switch S1. It will be appreciated that all of the switches advantageously can be closed during a read operation of the memory array 142 but can be selectively operated during a write operation, i.e., in order to write data to a selected one of the memory cells in the memory array 142, the corresponding source line is asserted.

Thus, an exemplary one transistor/one capacitor (1T/1C) memory cell array is provided by the present invention. In the exemplary case under discussion, each of the 1T/1C memory cells is a ferroelectric capacitor operatively coupled to the gate electrode of a charge amplifier. Preferably, the charge amplifier is a transistor and, most preferably, the charge amplifier is a CMOS transistor. In an exemplary embodiment, the memory cell array is N rows by M columns of memory cells, and wherein the each of the M columns is defined by an associated digitline and an associated source line.

Figure 4:
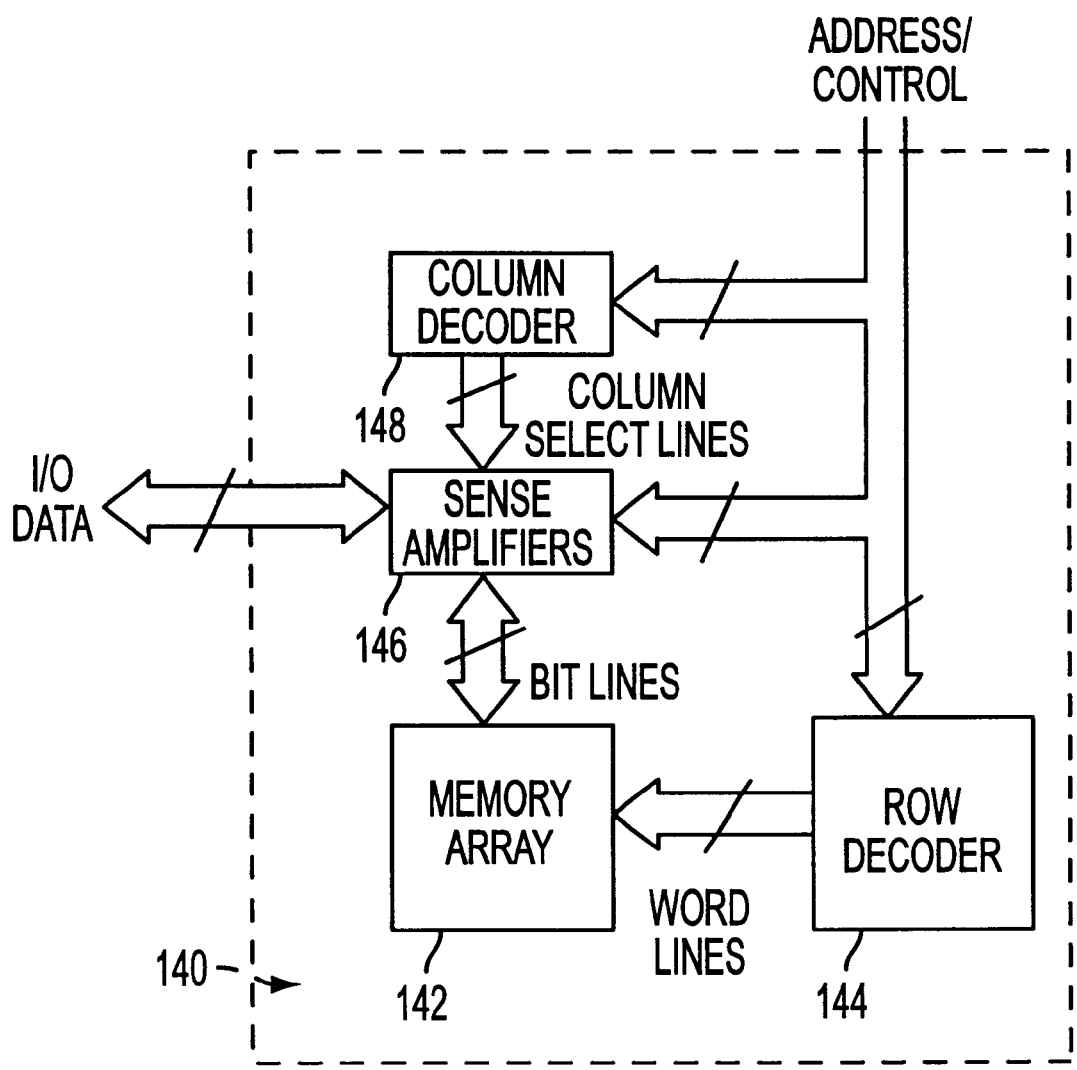
FIG. 4 is a high-level block diagram of a memory array device which can be fabricated using the memory cell depicted in FIG. 2(b)

Referring to FIG. 4, an exemplary DRAM circuit 140 is illustrated. The DRAM 140 contains a memory cell array 142, row and column decoders 144, 148 and a sense amplifier circuit 146. The memory cell array 142 consists of a plurality of memory cells 100 (constructed as illustrated in FIG. 2(a)) whose word lines 110 and digitlines 112 are commonly arranged into rows and columns, respectively. The digitlines 112 of the memory array 142 are connected to the sense amplifier circuit 146, while its word lines 110 are connected to the row decoder 144. The source lines for all memory cells 100 is grounded, preferably by source line 116. Address and control signals are input into the DRAM 140 and connected to the column decoder 148, sense amplifier circuit 146 and row decoder 144 and are used to gain read and write access, among other things, to the memory array 142.

The column decoder 148 is connected to the sense amplifier circuit 146 via control and column select signals. The sense amplifier circuit 146 receives input data destined for the memory array 142 and outputs data read from the memory array 142 over input/output (I/O) data lines. Data is read from the cells of the memory array 142 by activating a word line (via the row decoder 144), which couples all of the memory cells 100 corresponding to that word line 110 to respective digitlines 112, which define the columns of the array. One or more of the digitlines 112 are also activated. When a particular wordline-digitline pair is activated, the sense amplifier circuit 146 connected to a digitline column detects and amplifies the data bit impressed on the capacitor 118 of the memory cell 100 to its respective digit line 112 by measuring the potential difference between the activated digitline and a reference line which may be an inactive bit line. The operation of DRAM sense amplifiers is described, for example, in U.S. Pat. Nos. 5,627,785, 5,280,205, and 5,042,011, all of which are assigned to Micron Technology Inc., and all of which are incorporated herein by reference for all purposes.

Thus, a memory cell array according to the present invention includes a plurality of memory cells organized as an array of rows and columns, where at least one of the memory is a non-volatile memory cell having a charge transistor having a gate opposing a channel region coupling source and drain regions, a digitline coupled to the drain region, a source line coupled to the source region, a ferroelectric capacitor which stores data coupled to the gate, a wordline coupled to the ferroelectric capacitor, and a sense amplifier coupled to the digitline of the at least one memory cell. Preferably, the ferroelectric capacitor has a surface area which is small relative to the surface area of the gate. Most preferably, the ferroelectric capacitor is an edge defined ferroelectric capacitor. In an exemplary case, the data is written into the ferroelectric capacitor when the wordline and source line are asserted and the data is read from the non-volatile memory cell when the wordline, the digitline and the source line are asserted. In an exemplary case, an asserted source line is a grounded source line. Preferably, the charge amplifier amplifies the charge stored in the ferroelectric capacitor by at least one order of magnitude. In any event, the charge amplifier amplifies the charge stored in the ferroelectric capacitor by a predetermined gain factor. The charge amplifier advantageously can be a transistor.

The operation of the memory cell 100 according to the present invention will now be described while referring to FIGS. 2(b), 5, and 6(a)–6(f).

Figure 5:
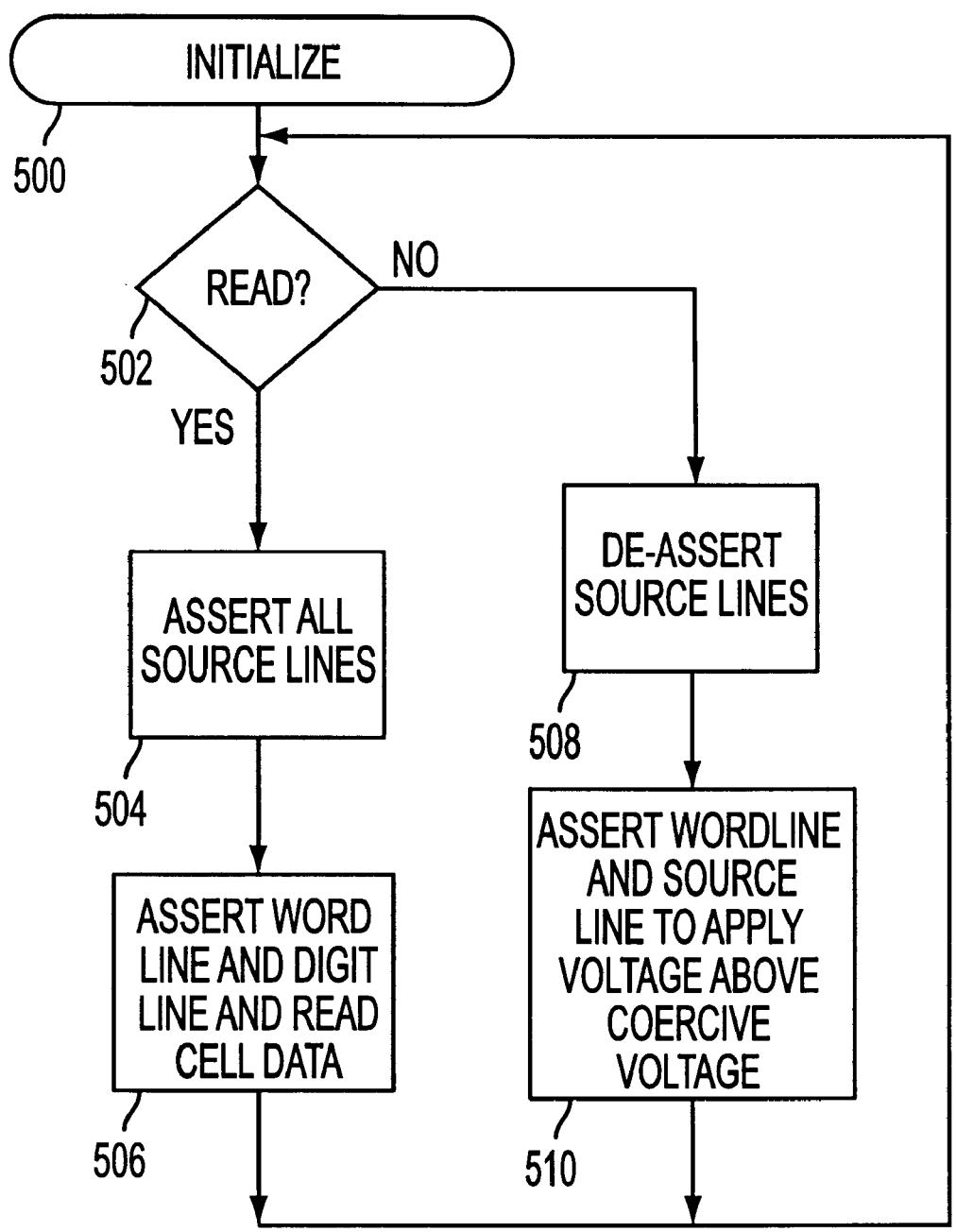
FIG. 5 is a flow chart illustrating a method for accessing the memory cell depicted in FIG. 2(a)

Referring now to FIG. 5, after the system in which the memory device 142 is located is initialized, a check is first performed to determine whether the memory cells 100 are being accessed for a read operation during step 502. If the answer is affirmative, all of the source lines are coupled to ground potential during step 504 by operation of switches S1, S2, etc., and then a read operation is performed in the normal manner for a DRAM, i.e., the wordline and digitlines for a particular memory cell are asserted, during step 506, which read operation is well known to one of ordinary skill in the art and will not be described further in the interest of brevity. However, the principal which permits the memory cell 100 to be read out normally will be discussed below. Irrespective of whether step 506 or step 510 (discussed below) is performed, step 502 is then repeated. It will be appreciated that as long as the voltage applied to the wordline 110 remains in the normal operating range of the transistor 114, e.g., 3 V, the coercive voltage of the ferroelectric capacitor 118 is not exceeded and the state of the ferroelectric capacitor is unchanged. See FIGS. 6(a) and 6(b).

When the answer at step 502 is negative, the source line for all of the memory cells are deasserted, i.e., the switches S1, S2, etc., are opened during step 508. Then, a voltage in excess of the coercive voltage Vc for the ferroelectric capacitor 118 is applied to the wordline 110 of memory cell 100 while the source 116 for the selected cell(s) is(are) grounded and all other source lines 112 are open circuited. A voltage in excess of the coercive voltage Vc for the ferroelectric capacitor 118 is thus applied by assertion of the wordline 110 and source line 116 for the selected memory cell. It will be appreciated that the value stored in the ferroelectric capacitor 118 is determined by the polarity of the voltage applied. For example, as illustrated in FIGS. 6(c) and 6(d), when a +5 V potential is applied to wordline 110, a value corresponding to one digital level, e.g., "one," is stored in the ferroelectric capacitor 118. In contrast, application of a −5 V potential to the wordline results in the opposite digital level i.e., "zero," being stored in the ferroelectric capacitor 118, as illustrated in FIGS. 6(e) and 6(f). It will also be appreciated that the correspondence between the stored charge polarity and the digital value is arbitrary; a positive potential advantageously can be used to write a digital "zero" into ferroelectric capacitor 118. It should be mentioned that the time needed to write to the memory cell 100 in memory array 142 is substantially to the read time for the memory cell.

Thus, the read operation is achieved by driving the word line to some voltage less than the coercive or programming voltage, and reading the conductivity of the transistor. The capacitance of the wordline 110 of each memory cell 100 advantageously be comparable to that in DRAMs since the gate capacitances are in series and, in the exemplary case under discussion, about 1 fF. It should be mentioned at this point that unlike the transistor in a conventional DRAM, the transistor 114 is not a passive transfer gate, but rather provides gain and charge multiplication. If the charge differences on the ferroelectric capacitor 118 are 10 $\mu C/cm^2$, and the area is $2 \times 10^{-9}$ cm$^2$, then the charge difference in the memory cell 100 itself is 2 fC. However, it will be appreciated that this charge is multiplied during the read operation by the transistor 114. Thus, if the difference in charge states of the ferroelectric capacitor 118 results in a drain current difference of 100 uA in the transistor 114 during a read cycle of 1 nanosecond (ns), then the differences in charge on the data or bit line 112 during read operation is approximately 100 fC. It will be appreciated that this value is comparable to that obtained using current DRAMs equipped with 30 ferroelectric capacitor storage capacitors and 3 V potential differences.

Thus, one exemplary embodiment of the present invention is a method for reading information from a one transistor/one capacitor (1T/1C) memory cell having a charge amplifier including a gate disposed adjacent to a channel region coupling source and drain regions, a digitline coupled to drain region, a source line coupled to the source region, a ferroelectric capacitor coupled to the gate, and a wordline coupled to the ferroelectric capacitor, the method including grounding the source line, asserting the wordline and digitline, amplifying the charge on the ferroelectric capacitor, and determining the resultant charge on the digitline. Preferably, a voltage less than the coercive voltage of the ferroelectric capacitor is asserted on the wordline while a predetermined voltage, e.g., $V_{DD}$, is asserted on the digitline.

A complementary embodiment of the present invention is a method for writing information to a one transistor/one capacitor (1T/1C) memory cell having a charge amplifier including a gate disposed adjacent to a channel region coupling source and drain regions, a digitline coupled to drain region, a source line coupled to the source region, a ferroelectric capacitor coupled to the gate, and a wordline coupled to the ferroelectric capacitor, the method including asserting the source line, and asserting the wordline to thereby apply a potential greater than the coercive voltage of the ferroelectric capacitor across the ferroelectric capacitor and the charge amplifier.

Figure 7:
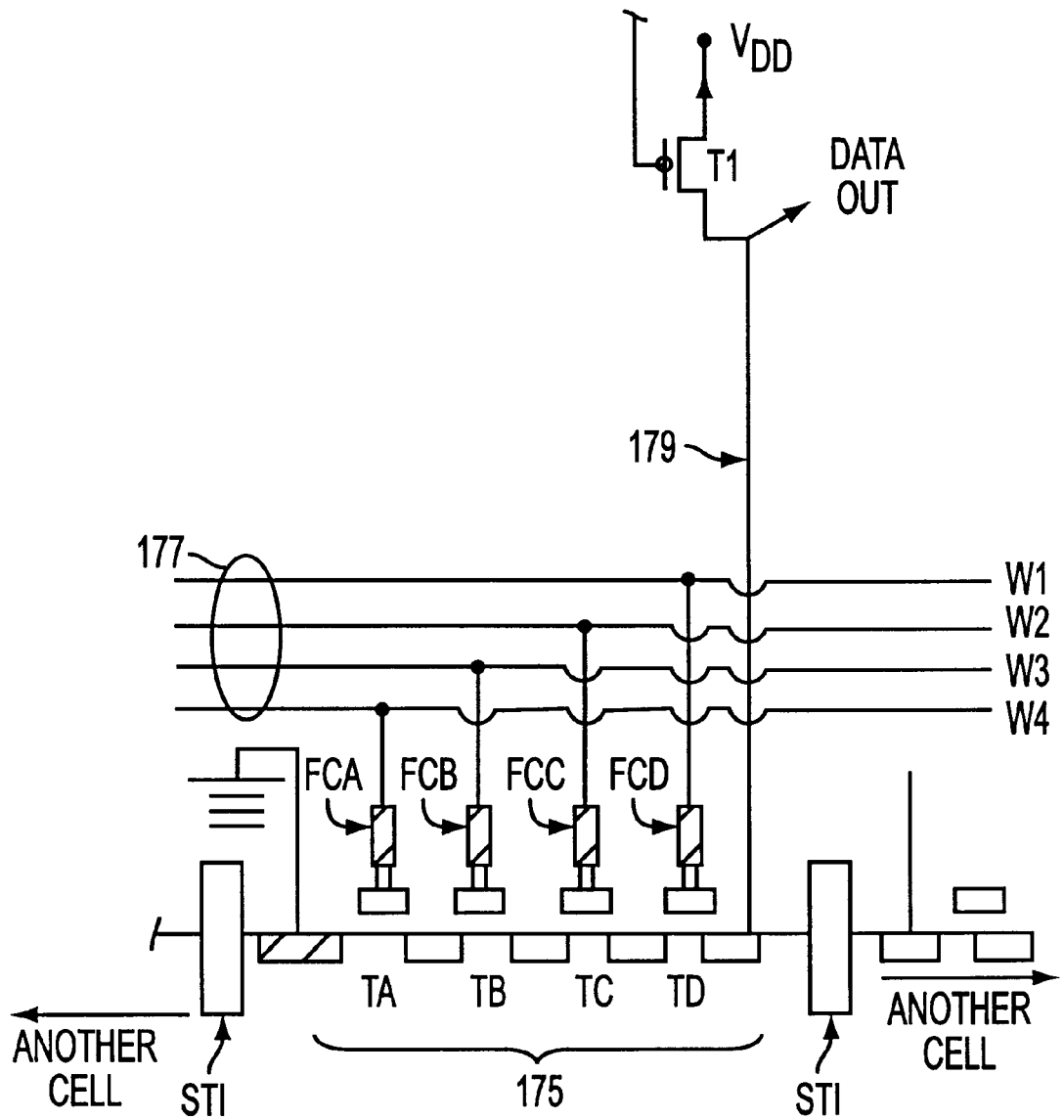
FIG. 7 illustrates a NAND logic device which is formed using the basic NVRAM cell according to the present invention.

It will be appreciated that several ferroelectric capacitor/transistor pairs advantageously can be fabricated into a NAND gate 175, as illustrated in FIG. 7. In the NAND gate 175, a plurality of ferroelectric capacitor FCA, FCB, FCC, and FCD are coupled to the gates of respective transistors TA, TB, TC, and TD. From FIG. 7, it will be noted that the output of NAND gate 175 can be sensed on digitline 179 when all of the gates are asserted. In an exemplary case, all of the gates of transistor TA–TD are asserted when the wordlines 177, e.g., wordlines W1, W2, W3, and W4, are all asserted. The source of transistor TA advantageously can be coupled to ground.

Stated another way, a logic device according to the present invention includes N+1 source/drain regions, N channels, each channel coupling adjacent ones of the N+1 source/drain regions, N gates disposed adjacent to the N channels, N ferroelectric capacitors, each of the N ferroelectric capacitors coupled to a respective one of the N gates, N wordlines, each of the N wordlines coupled to a respective one of the N ferroelectric capacitors, a digitline couple to an end one of the N+1 source/drain regions, and a source line coupled to the other end one of the N+1 source/drain regions. Preferably, the logic element is operated by assertion of all of the N wordlines. Advantageously, the ferroelectric capacitors are edge defined ferroelectric capacitors.

As previously mentioned, the ferroelectric capacitor 118 according to the present invention advantageously can be an edge-defined ferroelectric capacitor. Fabrication of the ferroelectric capacitor will be discussed with respect to FIG. 8. However, before describing an exemplary process for the manufacture of memory cell 100, a brief review of the currently available technology, from which preferred methodology for the fabrication of one type of edge-defined capacitors, will be presented. It will be appreciated that the method discussed immediately below advantageously may be applied to other types of edge-defined capacitors.

As discussed above, the charge storage element 118 of a ferroelectric memory cell 100 consists of a ferroelectric film 118$b$ sandwiched between two electrodes 118$a$, 118$c$. Lead zirconate titanates, PbZr$_x$Ti$_{1-x}$O$_3$ (PZT) with x=0.4–0.53 are most studied materials for memory applications, since PZT films with thickness from 500 to 4000 Å can fill the ferroelectric requirements to a substantial degree. Other thin-film materials which advantageously can be employed in nonvolatile memory devices include BaMgF$_4$ and Bi$_4$Ti$_3$O$_{12}$ for application with the ferroelectric material gate insulator in FET. BaTiO$_3$, SrTiO$_3$ and (Sr,Ba)TiO$_3$ have demonstrated usefulness in application as dielectrics in DRAMs.

It will be appreciated that the use of sputtering for the deposition of PZT, Bi$_4$Ti$_3$O$_{12}$ and oxides was developed in the 1970s. RF diode, magnetron and ion-beam sputtering techniques have all been used with metallic and oxide targets. However, it is difficult to prepare large, dense ceramic targets, which are necessary to obtain uniform layers on large substrates. Therefore, reactive sputtering using metallic targets is more commonly used. Because of the volatility of Pb and PbO, the control of stoichiometry is a major problem, which problem can be minimized by the use of multi-target or multi-target ion beam sputtering. This technique is suitable for edge-defined capacitors.

Alternative techniques for the deposition of PZT films include Metal Organic Deposition (MOD) and a sol-gel process. With these processes, the ferroelectric film is formed by the thermal decomposition of a solution of organo metallic compounds which can be spun onto the substrate. The subsequent drying, firing and annealing processes of the film strongly influence the morphology and ferroelectric properties of the PZT. It should be mentioned that thicker films can be obtained by repeating the spinning, drying and firing sequence. The main advantage of these processes is the ease by which complex oxide films can be prepared. These techniques are applicable to edge-defined capacitors.

Yet another technique which is useful in the fabrication of ferroelectric capacitors is Organo Metallic Chemical Vapor Deposition (OMCVD), which offers advantages such as good step coverage, high deposition rate, and low-temperature deposition, and is particularly suitable to a type of edge-defined capacitors which might have ferroelectric material on a sidewall. Additionally, an ozone jet reactive evaporation technique has been developed to deposit thin lead zirconate titanate films. It will be appreciated that because lead has a low affinity with oxygen and high volatility, lead may re-evaporate from the film and/or diffuse into the electrode and leave lead vacancies in PZT films. In a sol-gel or sputtering process, excess lead is often added to compensate for this lead loss. However, problems resulting from lead diffusion into surrounding electrode material was not elevated by this practice, i.e., the use of excess lead during sputtering. For a chemical vapor deposition (CVD) process, since the wafer is being heated during film deposition, unreacted lead may easily diffuse into the electrode material. To mitigate the problems associated with metallic lead or less oxidized lead in the film, it was common to employ high-concentration ozone to oxidize lead vapor at low temperature, and obtain a fully oxidized amorphous films by the co-evaporation method. Rapid thermal annealing (RTA), 650° C. for 120 seconds in oxygen ambient, is then used to crystallize the amorphous film into perovskite structure without lead re-evaporation or lead diffusion. It will be appreciated that this technique is particularly well suited to the fabrication of edge-defined capacitors. Other methods for the preparation of ferroelectric thin films include molecular beam epitaxy (MBE), although application of this fabrication method makes it difficult to comply with competing requirements of IC production processes such as large wafers, high throughput, etc.

It will also be appreciated that an important parameter, one which will influence the properties of the ferroelectric capacitors, are the electrodes. Because of the chemical reactivity of PZT and related materials and relatively high processing temperatures (>600° C.), a very inert bottom electrode is required. In general, Pt-based electrodes are used which are deposited onto silicon oxide or nitride by sputtering using an adhesive layer such as TiN, Ti, or the two in combination. Although relatively inert, the Pt bottom electrode does affect the morphology and the ferroelectric properties of the PZT films and related materials.

It has been reported in the literature that better hysteresis properties of PZT films (by sol-gel process) are achievable when the PZT is deposited onto a multilayer stack of $Pt/RuO_2PZT/RuO_2/Pt$. It is speculated that the microstructure, in particular the grain size of PZT, of the PZT films were influenced by $RuO_2$. Beneficially, films with smaller grain sizes had larger coercive fields. In addition, the effect of microstructure on the electrical characteristics of sol-gel derived PZT thin films deposited on a Pt electrode have been demonstrated using different solutions, i.e., films with different degree of preferred orientation of the perovskite crystal as well as different grain size were obtained. It is believed that while smaller grains are generally desired to obtain good device to device uniformity, the electrical properties of these smaller grains require further evaluation before they can be deemed suitable for either NVRAM MEMORY CELL, in particular, or DRAM applications, in general.

As previously mentioned, another class of ferroelectric materials is the bismuth (Bi)-layer oxides. Bi-layer ferroelectric oxides have large polarization along the a or b axis, but no or little polarization along the c axis. $Bi_4Ti_3O_{12}$ is a typical bi-layer ferroelectric, and the synthesis of this material has been reported. However, the obtained remnant polarization is very small, less than 10 $\mu C/cm^2$ and fatigue endurance is poor. Recently, other types of bi-layer oxides, such as $SrBi_2Ta_2O_9$ or $SrBi_2Nb_2O_9$ were found to have good endurance.

Figure 8:
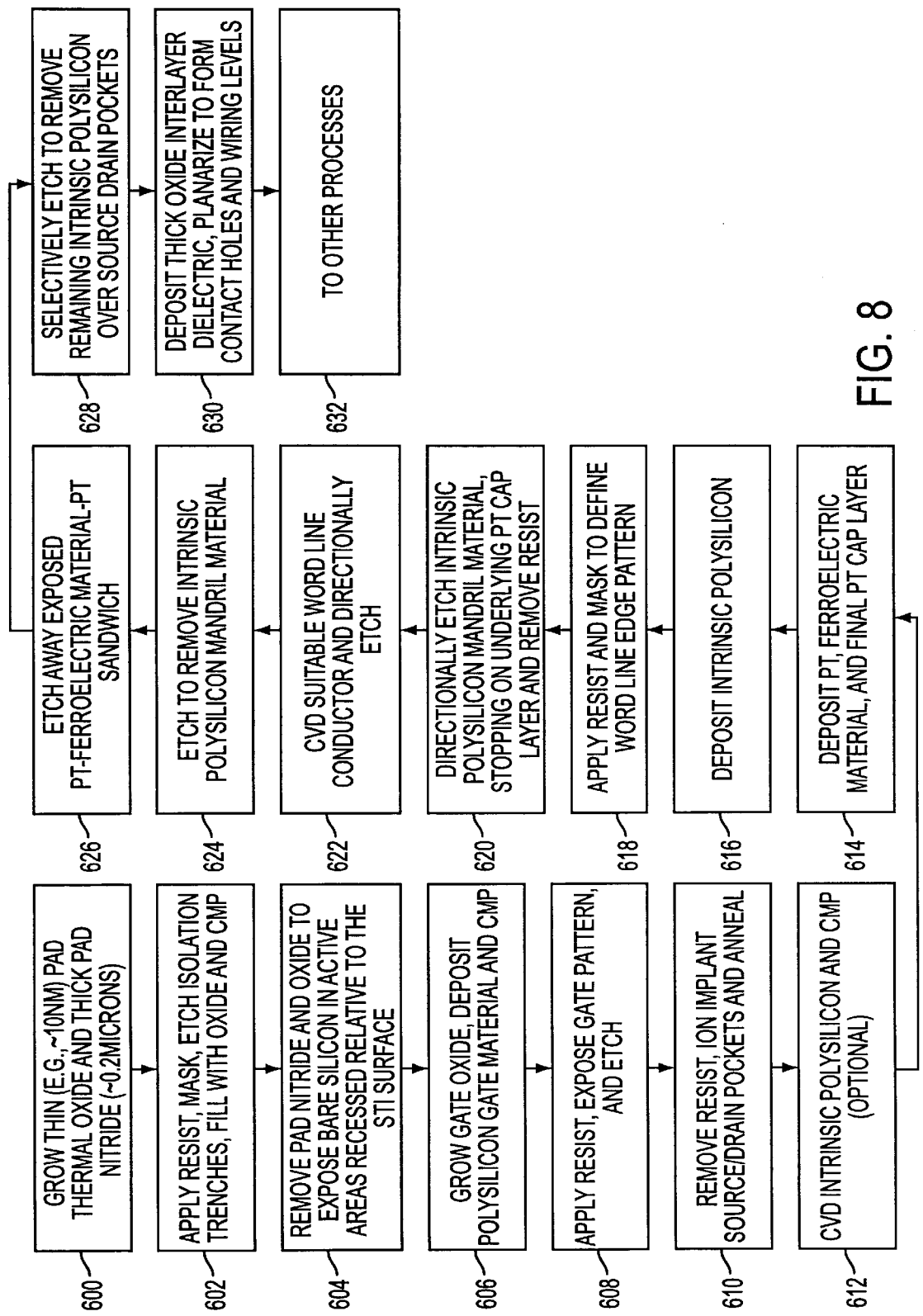
FIG. 8 is a flow chart illustrating the process flow for fabricating the memory cell illustrated in FIG. 2(a)

Referring now to FIG. 8, a process flow for integration of ferroelectric capacitors into the memory devices 140 will now be described. It should be mentioned that the process flow is geared to produce a memory cell pair; the process advantageously can be employed in fabricating the memory array 142 or the NAND gate 175 by proper selection of various process masks. It should also be mentioned at this point that such integration should not degrade the ferroelectric properties of the film. One example of process integration with a stacked capacitor structure was shown by Onish, et al., in the article entitled "A Half-Micron Ferroelectric Memory Cell Technology with Stacked Capacitor Structure," (1994 IEDM Digest, pp. 843–846, 1994). However, an alternative exemplary process flow is described below which advantageously can be employed in fabricating the ferroelectric capacitors within spacer-defined wordlines 518. It should also be mentioned that the process flow described below advantageously can be employed in fabricating memory cell pairs sharing a common digitline.

Figure 9A:
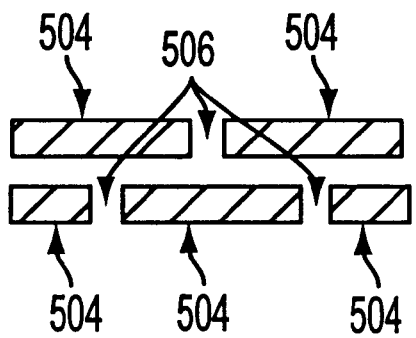
FIGS. 9(a) through 9(o) illustrate one of plan and section view of a workpiece at various steps of the process flow illustrated in FIG. 8.
Figure 9B:
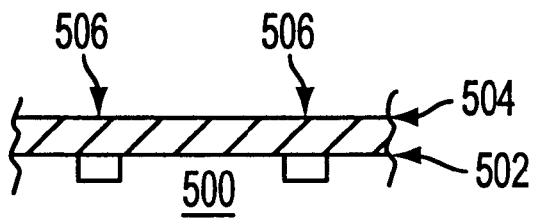

The process flow starts with a workpiece 500, e.g., a wafer fragment, following well formation and growth of a thin (e.g.,~10 nm) pad of thermal oxide 502 followed by deposition of a thick pad of nitride 504 (~0.2 $\mu$m) for formation of STI (shallow trench isolation) during step 600. During step 602, resist is applied and masked, isolation trenches are etched and filled with oxide 506 and the structure is subjected to chemical mechanical processing (CMP), as in other, conventional process flows. This leaves the structure as shown in FIGS. 9(a) and 9(b).

Figure 9C:
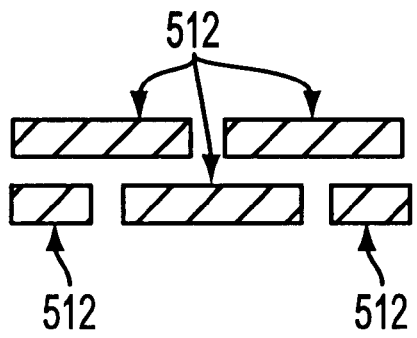
Figure 9D:
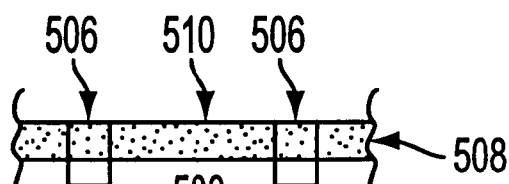

During step 604, the pad nitride 504 and oxide 502 is removed to expose bare silicon in the active areas, preferably recessed relative to the STI surface. Next, during step 606, gate oxide 508 is grown, prior to depositing polysilicon gate material 510 and subsequent CMP finishing to leave structure as shown in FIGS. 9(c) and 9(d).

Figure 9E:
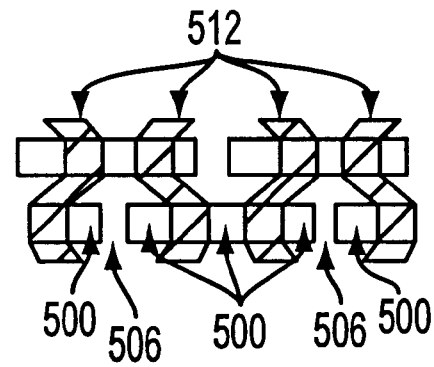
Figure 9F:
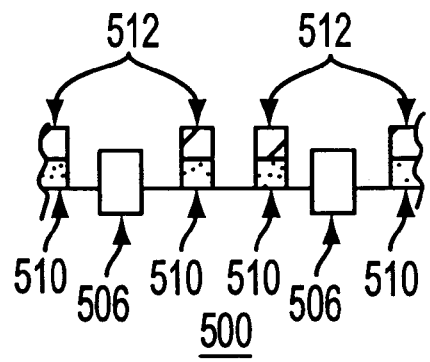

During step 608, a resist 512 is applied, the gate pattern is exposed, and the wafer is etched to produce the intermediate product depicted in FIGS. 9(e) and 9(f).

Figure 9G:
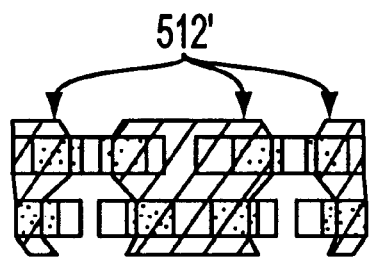
Figure 9H:
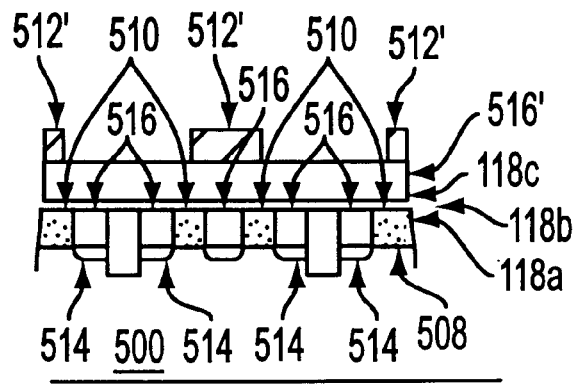

During step 610, the resist 512 is removed and the source/drain pockets 514 are ion implanted and annealed. During optional step 612, the wafer can be finished to restore surface planarity by chemical vapor deposition (CVD) of intrinsic polysilicon 516 followed by another round of CMP. During step 614, the ferroelectric capacitor 118 is formed by depositing a Pt layer 118a, a ferroelectric material layer 118b, and a final Pt cap layer 118c on the surface of the intrinsic polysilicon 516 and gate material 510. It will be appreciated that any of the deposition processes discussed in detail above advantageously can be employed in depositing the ferroelectric material layer. Moreover, the ferroelectric capacitor material 118b advantageously can be chosen from the non-limiting list of materials presented above. During step 616, intrinsic polysilicon 516' is deposited to a thickness equal to the desired height of the final spacer defined word lines (e.g., 0.2 $\mu$m). Then a resist 512' is applied and masked to define word line edge pattern illustrated in FIGS. 9(g) and 9(h) during step 618.

Figure 9I:
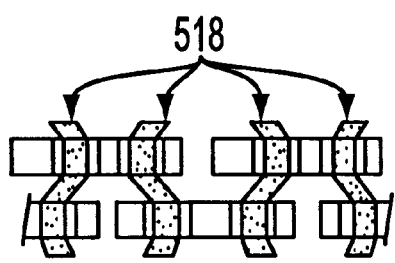
Figure 9J:
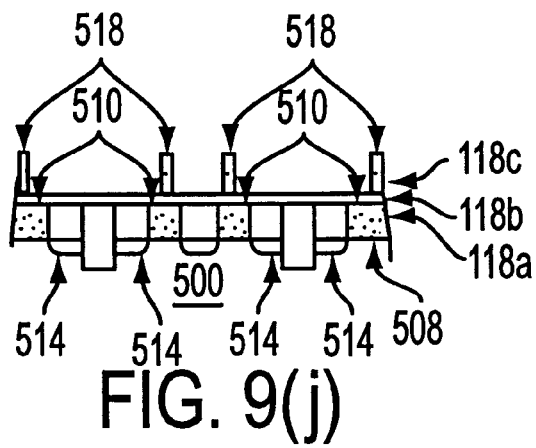

During step 620, the intrinsic polysilicon mandril material is directionally etched, preferably stopping on underlying Pt cap layer 118c and then the resist 512' is removed. During step 622, a suitable word line conductor 518 (e.g., doped polysilicon, refractory metal or silicide) is deposited by CVD and then directionally etched to leave conductor 518 as a spacer on the vertical edges of the mandril, i.e., to form edge-defined ferroelectric capacitors as shown in FIGS. 9(i) and 9(j).

Figure 9K:
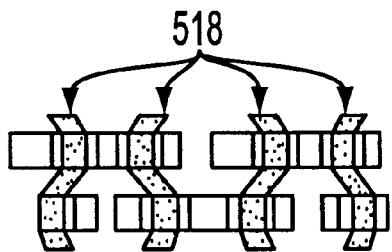
Figure 9L:
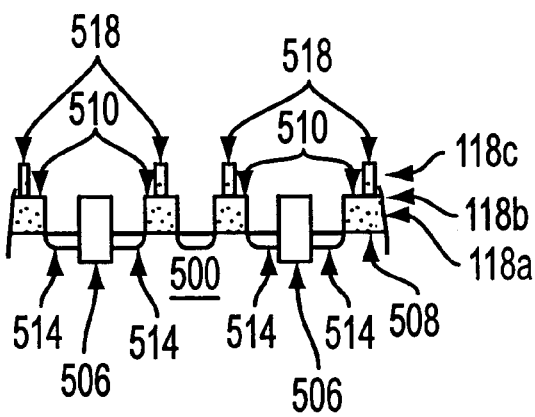

During step 624, a suitable selective etchant is employed to remove intrinsic polysilicon 516 mandril material. In step 626, the exposed Pt-ferroelectric material-Pt sandwich 118a, 118b, 118c is etched away. Moreover, during step 628, the workpiece 500 is selectively etched to remove any remaining intrinsic polysilicon 516 over the source/drain pockets 514, leaving the structure shown in FIGS. 9(k) and 9(l).

Figure 9O:
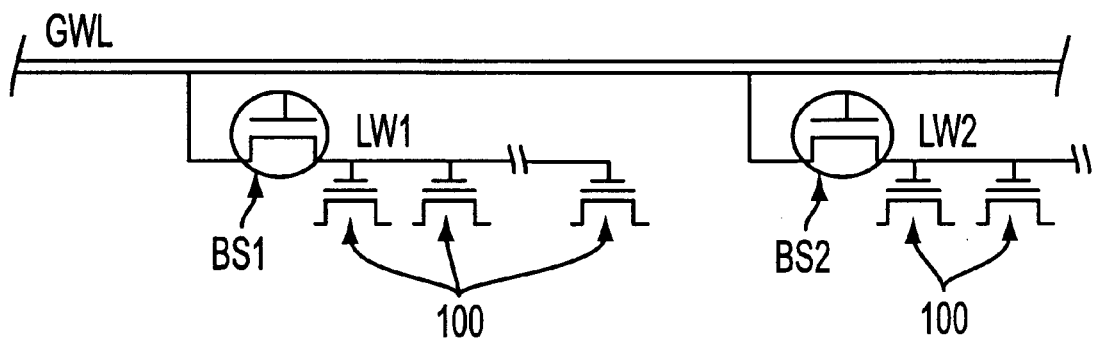
Figure 9M:
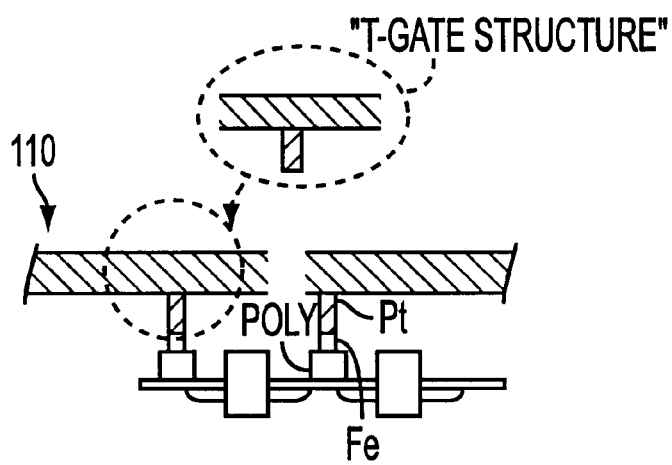
Figure 9N:
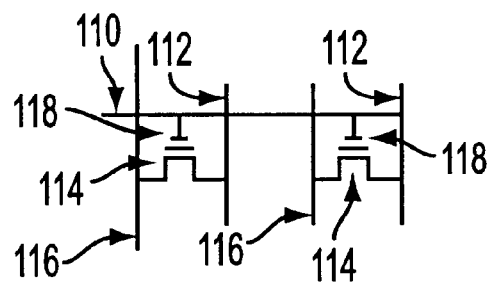

Finally, during step 630, a thick oxide interlayer dielectric is deposited, planarized to form contact holes and wiling levels as in conventional processing. It will be appreciated that when the wordlines 110 are formed, these wordlines will be considerably wider than the underlying ferroelectric capacitor 118, as illustrated in FIG. 9(m). It will be appreciated that FIG. 9(n), which is a schematic diagram of the memory cells illustrated in FIG. 9(m) is included to orient the reader.

It should also be mentioned that the process discussed above advantageously could be employed in fabricating other structures. For example, the memory array 142 advantageously could be fabricated as a number of subarrays, each having an associated block select switch, e.g., BS1, BS2, etc., serially coupling the local wordlines LW1, LW2, etc., to a global wordline GWL, as illustrated in FIG. 9(o).

Figure 10:
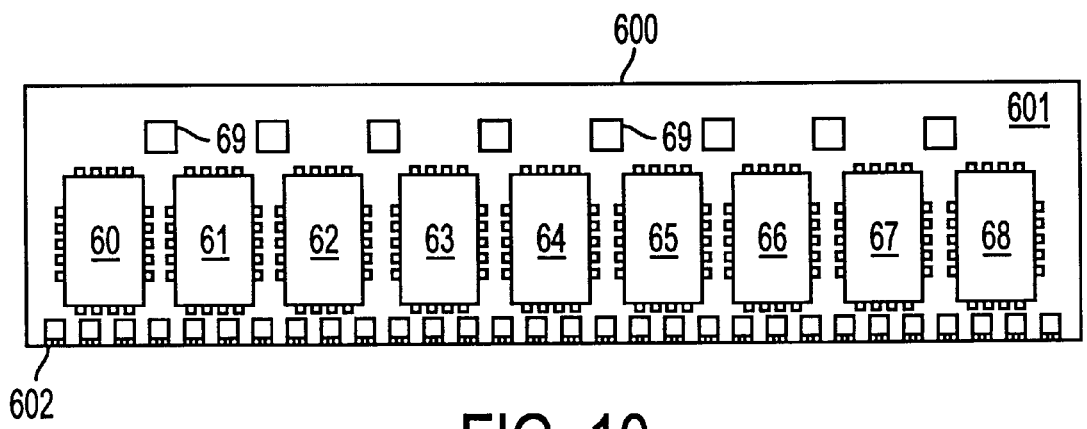
FIG. 10 is a plan view of a memory module having memory chips constructed according to the present invention.

FIG. 10 is plan view of a memory module 600 having memory chips 60–68 including semiconductor memory devices constructed in accordance with the present invention. That is, chips 60–68 have a NVRAM cell such as described in connection with FIG. 2. Memory module 600 is a SIMM (single in line memory module) having nine memory chips (IC's) 60–68 aligned on one side of a printed circuit board substrate. The number of such memory chips in the SIMM typically will vary between 3 to 9. The circuit board 601 has an edge connector 602 along one longitudinal edge to permit it to plug into a memory socket on a computer motherboard of conventional design (not shown). A wiring pattern (not shown), which can be a conventionally known design for this purpose, is formed on the board 601 and connects the terminals or leads shown comprising the edge connector 602 to the memory chips 60–68. Small ceramic decoupling capacitors 69 are also mounted on substrate 601 to suppress transient voltage spikes. Other than the memory device structures formed in accordance with the inventive method and used in memory chips 60–68, the general layout of the SIMM 600 can be a conventional construction.

Thus, another exemplary embodiment of the present invention is a memory module, including a substrate in, for example, a circuit board, a plurality of memory chips mounted on the die substrate, wherein one or more of the memory chips comprise a memory cell array fabricated on a semiconductor chip for communicating with a processor, the memory cell array including at least one non-volatile memory cell including a ferroelectric capacitor operatively coupled to the gate of a charge amplifier. Preferably, the gate is coupled to the ferroelectric capacitor by polysilicon, the junction formed at the gate has an intrinsic capacitance, and the capacitance of the ferroelectric capacitor is based on the magnitude of the intrinsic capacitance. Alternatively, the gate is coupled to the ferroelectric capacitor by polysilicon, the junction formed at the gate has an intrinsic capacitance, and the physical size of the ferroelectric capacitor is based on the magnitude of the intrinsic capacitance. Preferably, the ferroelectric capacitor includes a dielectric layer of lead zirconate titanate (PZT), which advantageously can be of the form $PbZr_xTi_{1-x}O_3$ with x ranging between 0.4 and 0.53. In an exemplary case, the non-volatile memory cell includes the charge amplifier having a gate disposed adjacent to a channel region coupling source and drain regions, a digitline coupled to drain region, a source line coupled to the source region, the ferroelectric capacitor coupled to the gate, and a wordline coupled to the ferroelectric capacitor.

Figure 11:
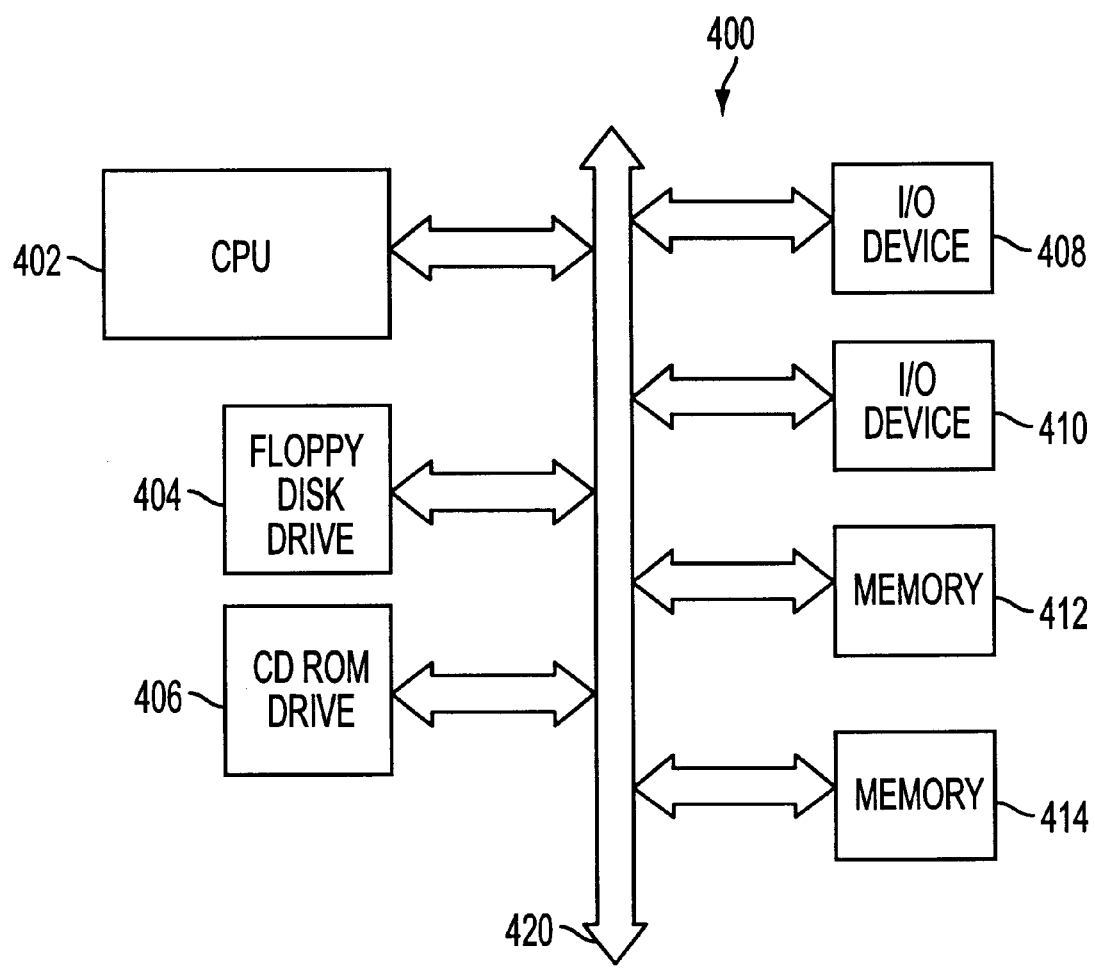
FIG. 11 is a high-level block diagram of a processor-based system employing NVRAM memory chips constructed according to the present invention.

FIG. 11 is a block diagram of a processor-based system 400 utilizing a memory 412 constructed in accordance with the present invention. That is, the memory 412 utilizes the memory cells 100 illustrated in FIG. 2(a), which advantageously can be provided in the form of the memory device 140. The processor-based system 400 may be a computer system, a process control system or any other system employing a processor and associated memory. The system 400 includes a central processing unit (CPU) 402, e.g., a microprocessor, that communicates with the RAM 412 and an I/O device 408 over a bus 420. It must be noted that the bus 420 may be a series of buses and bridges commonly used in a processor-based system, but for convenience purposes only, the bus 420 has been illustrated as a single bus. A second I/O device 410 is illustrated, but is not necessary to practice the invention. The processor-based system 400 also includes an additional memory 414, which could be either a read-only memory (ROM) or another of the memory devices 140 according to the present invention, since, as discussed above, the memory cells are non-volatile devices. The processor based system may include peripheral devices such as a floppy disk drive 404, a compact disk (CD) ROM drive 406, a display (not shown), a key board (not shown), and a mouse (not shown), that communicate with the CPU 402 over the bus 420 as is well known in the art.

It should be noted that since the memories 412 and 414 advantageously can be the memory device 140 according to the present invention, the number of discrete memory devices needed for the processor based system 400 can be reduced. Stated another way, since the memory array 142 according to the present invention is populated by non-volatile memory cells 100, a predetermined portion of the memory device 142 advantageously can be employed as the ROM in the processor based system 400.

Thus, another preferred embodiment of the present invention includes a processor based system, including a processor, and a memory cell array coupled to the processor, the memory cell array including a plurality of memory cells organized as an array of rows and columns, at least one of the memory cells being a non-volatile memory cell including a charge amplifier including a gate opposing a channel region coupling source and drain regions, a digitline coupled to the drain region, a source line coupled to the source region, a ferroelectric capacitor coupled to the gate, a wordline coupled to the ferroelectric capacitor, and a sense amplifier coupled to the digitline of the at least one memory cell. Preferably, data is written into the ferroelectric capacitor when the wordline and the source line are both asserted, while data is read out of the memory cell when the wordline, the digitline and the source line are asserted, under the control of the processor. Advantageously, the ferroelectric capacitor is an edge defined ferroelectric capacitor. Preferably, the ferroelectric capacitor is a dielectric layer of lead zirconate titanate (PZT) and, most preferably, the PZT forming the ferroelectric capacitor is of the form $PbZr_xTi_{1-x}O_3$ with x ranging between 0.4 and 0.53.

It should again be mentioned that all of the patents, patent applications, and articles cited to or discussed above are incorporated herein by reference for all purposes.

Although presently preferred embodiments of the present invention have been described and illustrated, it should be clearly understood that many variations and/or modifications can be made without departing from spirit and scope of the invention. Accordingly, the invention is not limited by the foregoing description but is only limited by the scope of the attached claims.

What is claimed is:

1. A one transistor/one capacitor (1T/1C) memory cell comprising an edge defined ferroelectric capacitor operatively coupled to the gate electrode of a charge amplifier transistor by a polysilicon interconnect, wherein the edge defined ferroelectric capacitor is in a stacked alignment with an active gate oxide channel region of the transistor.

2. The memory cell as recited in claim 1, wherein the ferroelectric capacitor has a surface area which is a predetermined percentage of the surface area of the gate electrode.

3. The memory cell as recited in claim 1, wherein the ferroelectric capacitor comprises an edge defined ferroelectric capacitor.

4. The memory cell as recited in claim 1, wherein the charge amplifier transistor comprises a CMOS transistor.

5. A memory cell comprising:
a charge amplifier comprising a gate adjacent to a channel region coupling source and drain regions;
a digitline coupled to one of the source and drain regions;
source line coupled to the other of the source and drain regions;
an edge defined ferroelectric capacitor coupled to the gate by a polysilicon interconnect; and
a wordline coupled to the edge defined ferroelectric capacitor, wherein the edge defined ferroelectric capacitor is in a stacked alignment with an active oxide channel region of the charge amplifier.

6. The memory cell as recited in claim 5, wherein the charge amplifier comprises a transistor.

7. The memory cell as recited in claim 5, wherein the charge amplifier comprises a CMOS transistor.

8. The memory cell as recited in claim 5, wherein:
the junction formed at the gate has an intrinsic capacitance; and
the capacitance of the ferroelectric capacitor is based on the magnitude of the intrinsic capacitance.

9. The memory cell as recited in claim 5, wherein:
the junction formed at the gate has an intrinsic capacitance; and
the physical size of the ferroelectric capacitor is based on the magnitude of the intrinsic capacitance.

10. The memory cell as recited in claim 9, wherein the thickness of a ferroelectric material layer in the ferroelectric capacitor is based on the magnitude of the intrinsic capacitance.

11. A memory cell comprising:
a charge amplifier comprising a gate opposing a channel region coupling source and drain regions;
a digitline coupled to the drain region;
a source line coupled to the source region;
an edge defined ferroelectric capacitor coupled to the gate by a polysilicon interconnect, the edge defined ferroelectric capacitor being configured to store data; and
a wordline coupled to the gate by the edge defined ferroelectric capacitor, wherein the edge defined ferroelectric capacitor is in a stacked alignment with an active gate oxide channel region of the charge amplifier.

12. The memory cell as recited in claim 11, wherein the charge amplifier is a CMOS transistor.

13. The memory cell as recited in claim 11, wherein the ferroelectric capacitor has a surface area which is a predetermined percentage of surface area of the gate of the charge amplifier.

14. The memory cell as recited in claim 11, wherein:
the junction formed at the gate has an intrinsic capacitance; and
the capacitance of the ferroelectric capacitor is based on the magnitude of the intrinsic capacitance.

15. The memory cell as recited in claim 11, wherein:
the junction formed at the gate has an intrinsic capacitance; and
the physical size of the ferroelectric capacitor is based on the magnitude of the intrinsic capacitance.

16. The memory cell as recited in claim 11, wherein the ferroelectric capacitor is an edge defined ferroelectric capacitor.

17. The memory cell as recited in claim 16, wherein the edge defined ferroelectric capacitor comprises a dielectric layer of lead zirconate titanate (PZT).

18. The memory cell as recited in claim 11, wherein the ferroelectric capacitor comprises a dielectric layer of lead zirconate titanate (PZT).

19. The memory cell as recited in claim 18, wherein the PZT comprising the ferroelectric capacitor is of the form $PbZr_xTi_{1-x}O_3$ with x ranging between 0.4 and 0.53.

20. A one transistor/one capacitor (1T/1C) memory cell array, wherein each of the 1T/1C memory cells comprises an edge defined ferroelectric capacitor operatively coupled to the gate electrode of a charge amplifier transistor by a polysilicon interconnect, wherein the edge defined ferroelectric capacitor is in a stacked alignment with an active gate oxide channel region of the transistor.

21. The memory cell array as recited in claim 20, wherein the charge amplifier transistor comprises a CMOS transistor.

22. The memory cell array as recited in claim 20, wherein the memory cell array comprises N rows by M columns of memory cells, and wherein the each of the M columns is defined by an associated digitline and an associated source line.

23. The memory cell array as recited in claim 20, wherein the surface area of the ferroelectric capacitor is a predetermined percentage of the surface area of the gate of the charge amplifier.

24. The memory cell array as recited in claim 23, wherein the ferroelectric capacitor is an edge defined ferroelectric capacitor.

25. The memory cell array as recited in claim 24, wherein the edge defined ferroelectric capacitor comprises a dielectric layer of lead zirconate titanate.

26. A memory cell array, comprising:
a plurality of memory cells organized as an array of rows and columns, at least one of the memory cells being a nonvolatile memory cell comprising:
a charge transistor comprising a gate opposing a channel region coupling source and drain regions;
a digitline coupled to the drain region;
a source line coupled to the source region,
an edge defined ferroelectric capacitor coupled to the gate by a polysilicon interconnect;
a wordline coupled to the edge defined ferroelectric capacitor; and
a sense amplifier coupled to the digitline of the at least one memory cell, wherein the edge defined ferroelectric capacitor is in a stacked alignment with an active gate oxide channel region of the transistor.

27. The memory cell array as recited in claim 26, wherein the ferroelectric capacitor has a surface area which is small relative to the surface area of the gate.

28. The memory cell array as recited in claim 26, wherein the ferroelectric capacitor comprises an edge defined ferroelectric capacitor.

29. The memory cell array as recited in claim 26, wherein data is written into the ferroelectric capacitor when the wordline and source line are asserted and data is read from the non-volatile memory cell when the wordline, the digitline and the source line are asserted.

30. The memory cell array as recited in claim 26, wherein an asserted source line comprises a grounded source line.

31. The memory cell array as recited in claim 26, wherein the charge amplifier amplifies the charge stored in the ferroelectric capacitor by at least one order of magnitude.

32. The memory cell array as recited in claim 26, wherein the charge amplifier amplifies the charge stored in the ferroelectric capacitor by a predetermined gain factor.

33. The memory cell array as recited in claim 26, wherein the charge amplifier comprises a transistor.

34. The memory cell array as recited in claim 33, wherein the transistor comprises a CMOS transistor.

35. A processor based system, comprising:

a processor; and a memory cell array coupled to the processor, the memory cell array including a plurality) of memory cells organized as an array of rows and columns, at least one of the memory cells being a non-volatile memory cell comprising:

a charge amplifier comprising a gate opposing a channel region coupling source and drain regions;

a digitline coupled to the drain region;

a source line coupled to the source region;

an edge defined ferroelectric capacitor coupled to the gate by a polysilicon interconnect;

a wordline coupled to the edge defined ferroelectric capacitor; and a sense amplifier coupled to the digitline of the at least one memory cell, wherein the edge defined ferroelectric capacitor is in a stacked alignment with an active gate oxide channel region of the charge amplifier.

36. The processor based system as recited in claim 35, wherein the charge amplifier comprises a transistor.

37. The processor based system as recited in claim 35, wherein, under the control of the processor:

data is written into the ferroelectric capacitor when the wordline and the source line are both asserted; and data is read out of the memory cell when the wordline, the digitline and the source line are asserted.

38. The processor based system as recited in claim 35, wherein ferroelectric capacitor comprises an edge defined ferroelectric capacitor.

39. The processor based system as recited in claim 35, wherein the ferroelectric capacitor comprises a dielectric layer of lead zirconate titanate (PZT).

40. The processor based system as recited in claim 39, wherein the PZT comprising the ferroelectric capacitor is of the form $PbZr_xTi_{1-x}O_3$ with x ranging between 0.4 and 0.53.

41. A memory module, comprising:

a substrate;

a plurality of memory chips mounted on the substrate, wherein one or more of the memory chips comprise a memory cell array fabricated on a semiconductor chip and communicating with a processor, said memory cell array comprising at least one non-volatile memory cell comprising an edge defined ferroelectric capacitor operatively coupled to the gate of a charge amplifier by a polysilicon interconnect, wherein the edge defined ferroelectric capacitor is in a stacked alignment with an active gate oxide channel region of the charge amplifier.

42. The memory module as recited in claim 41, wherein:

the junction formed at the gate has an intrinsic capacitance; and the capacitance of the ferroelectric capacitor is based on the magnitude of the intrinsic capacitance.

43. The memory module as recited in claim 41, wherein:

the junction formed at the gate has an intrinsic capacitance; and the physical size of the ferroelectric capacitor is based on the magnitude of the intrinsic capacitance.

44. The memory module as recited in claim 41, wherein the ferroelectric capacitor comprises a dielectric layer of lead zirconate titanate (PZT).

45. The memory module as recited in claim 18, wherein the PZT comprising the ferroelectric capacitor is of the form $PbZr_xTi_{1-x}O_3$ with x ranging between 0.4 and 0.53.

46. The memory module as recited in claim 41, wherein the non-volatile memory cell comprises:

the charge amplifier, which comprises the gate disposed adjacent to a channel region coupling source and drain regions;

a digitline coupled to drain region;

a source line coupled to the source region, the ferroelectric capacitor coupled to the gate; and a wordline coupled to the ferroelectric capacitor.

47. A method for reading information from a one transistor/one capacitor (1T/1C) memory cell having a charge amplifier including a gate disposed adjacent to a channel region coupling source and drain regions, a digitline coupled to the drain region, a source line coupled to the source region, an edge defined ferroelectric capacitor coupled to the gate by a polysilicon interconnect, and a wordline coupled to the ferroelectric capacitor, wherein the edge defined ferroelectric capacitor is in a stacked alignment with an active gate oxide channel region of the charge amplifier, the method comprising:

grounding the source line;

asserting the wordline and digitline;

amplifying the charge on the edge defined ferroelectric capacitor; and determining the resultant charge on the digitline.

48. The method as recited in claim 47, wherein the asserting step further comprises asserting the wordline at a voltage less than the coercive voltage of the ferroelectric capacitor.

49. The method as recited in claim 47, wherein the asserting step further comprises asserting the digitline which has been charged to a predetermined voltage value.

50. A method for writing information to a one transistor/one capacitor (1T/1C) memory cell having a charge amplifier including a gate disposed adjacent to a channel region coupling source and drain regions, a digitline coupled to the drain region, a source line coupled to the source region, an edge defined ferroelectric capacitor coupled to the gate by a polysilicon interconnect, and a wordline coupled to the edge defined ferroelectric capacitor, wherein the edge defined ferroelectric capacitor is in a stacked alignment with an active gate oxide channel region of the charge amplifier, the method comprising:

asserting the source line; and asserting the wordline to thereby apply a potential greater than the coercive voltage of the edge defined ferroelectric capacitor across the edge defined ferroelectric capacitor and the charge amplifier.

51. The method as recited in claim 50, wherein the asserted source line comprises a grounded source line.

52. A logic element, comprising:

N+1 source/drain regions;

N channels, each channel coupling adjacent ones of the N+1 source/drain regions;

N gates disposed adjacent to the N channels;

N edge defined ferroelectric capacitors, each of the N edge defined ferroelectric capacitors coupled to a respective one of the N gates by a polysilicon interconnect;

a digitline coupled to an end one of the N+1 source/drain regions; and a source line coupled to the other end one of the N+1 source/drain regions wherein each of the N edge defined ferroelectric capacitors is in a stacked alignment with an active gate oxide channel region of a respective one of the N gates.

53. The logic element as recited in claim 52, wherein the logic element is operated by assertion of all of the N gates.

54. The logic element as recited in claim 52, wherein the ferroelectric capacitors comprise edge defined ferroelectric capacitors.

55. The logic element as recited in claim 52, further comprising N wordlines, each of the N wordlines coupled to a respective one of the N ferroelectric capacitors, wherein the logic element is operated by assertion of all of the N wordlines coupled to respective N gates.

* * * * *

UNITED STATES PATENT AND TRADEMARK OFFICE
CERTIFICATE OF CORRECTION

PATENT NO. : 6,337,805 B1
DATED : January 8, 2002
INVENTOR(S) : Leonard Forbes et al.

It is certified that error appears in the above-identified patent and that said Letters Patent is hereby corrected as shown below:

Column 1,
Line 12, "APPARATUS" should be -- APPARATUSES --.

Column 3,
Line 43, "implement" should be -- implemented --.

Column 5,
Line 17, "couple" should be -- coupled --.

Column 8,
Line 59, "VRAM" should be -- NVRAM --.

Column 14,
Line 60, "wiling" should be -- wiring --.

Column 19,
Line 4, "plurality)" should be -- plurality --.

Signed and Sealed this

Twenty-eighth Day of January, 2003

JAMES E. ROGAN
*Director of the United States Patent and Trademark Office*